(12) United States Patent
Foo et al.

(10) Patent No.: US 10,438,897 B2
(45) Date of Patent: Oct. 8, 2019

(54) FIDUCIAL MARK FOR CHIP BONDING

(71) Applicant: 3M INNOVATIVE PROPERTIES COMPANY, St. Paul, MN (US)

(72) Inventors: Siang Sin Foo, Singapore (SG); Hiromitsu Kosugi, Singapore (SG); Alejandro Aldrin A. Narag, II, Singapore (SG); Ravi Palaniswamy, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/753,426

(22) PCT Filed: Aug. 30, 2016

(86) PCT No.: PCT/US2016/049413
§ 371 (c)(1),
(2) Date: Feb. 19, 2018

(87) PCT Pub. No.: WO2017/040482
PCT Pub. Date: Mar. 9, 2017

(65) Prior Publication Data
US 2018/0240756 A1    Aug. 23, 2018

Related U.S. Application Data

(60) Provisional application No. 62/213,371, filed on Sep. 2, 2015.

(51) Int. Cl.
*H01L 23/544* (2006.01)
*H01L 23/498* (2006.01)
(Continued)

(52) U.S. Cl.
CPC ........ *H01L 23/544* (2013.01); *H01L 21/4857* (2013.01); *H01L 23/4985* (2013.01);
(Continued)

(58) Field of Classification Search
CPC ............ H01L 23/544; H01L 23/49811; H01L 23/49827; H01L 23/4985; H01L 21/4857;
(Continued)

(56) References Cited

U.S. PATENT DOCUMENTS

| | | | |
|---|---|---|---|
| 2013/0001633 A1* | 1/2013 | Imai | H01L 33/60 257/99 |
| 2014/0167611 A1* | 6/2014 | Tischler | H05B 33/089 315/90 |
| 2015/0029680 A1 | 1/2015 | Saito | |

FOREIGN PATENT DOCUMENTS

| | | |
|---|---|---|
| EP | 0 341 629 | 11/1989 |
| WO | WO 2014/171890 | 10/2014 |

OTHER PUBLICATIONS

PCT International Search Report from PCT/US2016/049413, dated Dec. 9, 2016, 5 pages.

* cited by examiner

*Primary Examiner* — Mamadou L Diallo
(74) *Attorney, Agent, or Firm* — Jonathan L. Tolstedt

(57) ABSTRACT

A flexible multilayer construction (100) for mounting a light emitting semiconductor device (200) (LESD), includes a flexible dielectric substrate (110) having an LESD mounting region (120), first and second electrically conductive pads (130, 140) disposed in the LESD mounting region for electrically connecting to corresponding first and second electrically conductive terminals of an LESD (200) received in the LESD mounting region, and a first fiducial alignment mark (150) for an accurate placement of an LESD in the LESD mounting region. The first fiducial alignment mark is disposed within the LESD mounting region.

20 Claims, 2 Drawing Sheets

(51) Int. Cl.
*H01L 23/00* (2006.01)
*H05K 1/02* (2006.01)
*H05K 1/18* (2006.01)
*H01L 33/62* (2010.01)
*H01L 21/48* (2006.01)
*H05K 1/11* (2006.01)
*H05K 3/32* (2006.01)
*H05K 3/34* (2006.01)

(52) U.S. Cl.
CPC .. *H01L 23/49811* (2013.01); *H01L 23/49822* (2013.01); *H01L 23/49827* (2013.01); *H01L 24/81* (2013.01); *H01L 24/83* (2013.01); *H01L 24/85* (2013.01); *H01L 33/62* (2013.01); *H05K 1/0269* (2013.01); *H05K 1/189* (2013.01); *H01L 24/13* (2013.01); *H01L 24/16* (2013.01); *H01L 24/29* (2013.01); *H01L 24/32* (2013.01); *H01L 24/48* (2013.01); *H01L 2223/5442* (2013.01); *H01L 2223/54426* (2013.01); *H01L 2223/54486* (2013.01); *H01L 2224/10175* (2013.01); *H01L 2224/131* (2013.01); *H01L 2224/1319* (2013.01); *H01L 2224/26175* (2013.01); *H01L 2224/2919* (2013.01); *H01L 2224/81132* (2013.01); *H01L 2224/81385* (2013.01); *H01L 2224/83132* (2013.01); *H01L 2224/83385* (2013.01); *H01L 2224/85132* (2013.01); *H01L 2224/85385* (2013.01); *H01L 2924/00014* (2013.01); *H01L 2924/12041* (2013.01); *H01L 2933/0066* (2013.01); *H05K 1/111* (2013.01); *H05K 3/321* (2013.01); *H05K 3/3436* (2013.01); *H05K 2201/09745* (2013.01); *H05K 2201/09918* (2013.01); *H05K 2201/10106* (2013.01)

(58) Field of Classification Search
CPC ......... H01L 24/81; H01L 24/83; H01L 24/85;
H01L 24/13; H01L 24/16; H01L 24/29;
H01L 24/32; H01L 24/48; H01L 33/62;
H01L 2223/5442; H01L 2223/54426;
H01L 2223/54486; H01L 2223/10185;
H01L 2223/131; H01L 2223/1319; H01L
2223/26175; H01L 2223/2919; H01L
2223/81132; H01L 2223/81385; H01L
2223/83132; H01L 2223/85385; H01L
2924/00014; H01L 2924/12041; H01L
2933/0066; H05K 1/0269; H05K 1/189;
H05K 1/111; H05K 3/321; H05K 3/3436;
H04K 2201/09745; H04K 2201/09918;
H04K 2201/10106
See application file for complete search history.

FIDUCIAL MARK FOR CHIP BONDING

BACKGROUND

Flexible circuits and assemblies are often used as connectors in various applications of electronics equipment, such as printers, computers, monitors and the like. Such circuits offer a benefit over previously used rigid circuit boards in both flexibility and space savings.

Where LEDs are attached to flexible circuits and assemblies, an attachment technique may be utilized. Various dies attachment techniques have been used for, e.g., flip chip dies, including attachment using solder bump and eutectic bonding, which are attractive due to the need for less attachment material (and correspondingly, lower cost) and performance and better reliability. Eutectic bonding generally takes place through inter-metallic bonding of gold and tin. However, despite the advantages of the bonding process, it requires a high level of placement accuracy between die pads and the LED being attached.

SUMMARY

The present disclosure relates to a flexible multilayer construction for mounting a light emitting semiconductor device (LESD). A fiducial alignment mark is disposed within a LESD mounting region of the flexible multilayer construction. The fiducial alignment mark can be disposed within an interior perimeter of the first or second electrically conductive pads that can couple to terminals of an LESD. In some embodiments the fiducial mark forms a groove in the electrically conductive pad and is adapted to be proximate to and extend along a side of a first electrically conductive terminal of an LESD mounted in the LESD mounting region, such that when the first electrically conductive terminal is being electrically connected to the first electrically conductive pad using a conductive material that flows away from the first electrically conductive terminal toward the first groove, the first groove is sufficiently deep and wide so that a substantial portion of the flowing first electrically conductive terminal at least partially fills the first groove.

In one aspect, the present description relates to a flexible multilayer construction for mounting a light emitting semiconductor device (LESD). This construction includes a flexible multilayer construction for mounting a light emitting semiconductor device (LESD), includes a flexible dielectric substrate having an LESD mounting region, first and second electrically conductive pads disposed in the LESD mounting region for electrically connecting to corresponding first and second electrically conductive terminals of an LESD received in the LESD mounting region, and a first fiducial alignment mark for an accurate placement of an LESD in the LESD mounting region. The first fiducial alignment mark disposed within the LESD mounting region.

In another aspect, the present description relates to a LESD package. The LESD package includes the flexible multilayer construction described herein and an LESD mounted in the LESD mounting region of the flexible dielectric substrate. The LESD having a first conductive terminal electrically connected to the first electrically conductive pad and a second conductive terminal electrically connected to the second electrically conductive pad. At least a portion of the first fiducial alignment mark is visible in a plan view of the LESD package.

In another aspect, the present description relates to a flexible multilayer construction for mounting a light emitting semiconductor device (LESD). The construction includes a flexible dielectric substrate comprising opposing top and bottom major surfaces and an LESD mounting region on the top major surface for receiving an LESD and first and second electrically conductive pads disposed in the LESD mounting region for electrically connecting to corresponding first and second electrically conductive terminals of an LESD received in the LESD mounting region. One or more grooves are formed in the first electrically conductive pad within an interior of a perimeter of the first and optionally second electrically conductive pad. Each of the one or more grooves is adapted to be proximate to and extend along a side of a first electrically conductive terminal of an LESD mounted in the LESD mounting region, such that when the first electrically conductive terminal is being electrically connected to the first electrically conductive pad using a conductive material that flows away from the first electrically conductive terminal toward the one or more grooves. The one or more grooves are sufficiently deep and wide so that a substantial portion of the flowing first electrically conductive terminal at least partially fills the one or more grooves.

In further aspect, the present description relates to a method of fabricating a flexible multilayer construction for mounting a light emitting semiconductor device (LESD). The method includes providing a flexible dielectric substrate having opposing top and bottom major surfaces and defining an LESD mounting region on the top major surface of the flexible dielectric substrate for receiving an LESD. Then the method includes forming a pattern corresponding to a first fiducial alignment mark in the LESD mounting region, and forming first and second electrically conductive pads in the LESD mounting region on the top major surface of the flexible dielectric substrate for electrically connecting to corresponding first and second electrically conductive terminals of an LESD received in the LESD mounting region. The first electrically conductive pad bordering a perimeter of the first fiducial mark. Then the method includes removing the pattern resulting in a first fiducial alignment mark formed within an interior of a perimeter of the first electrically conductive pad.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
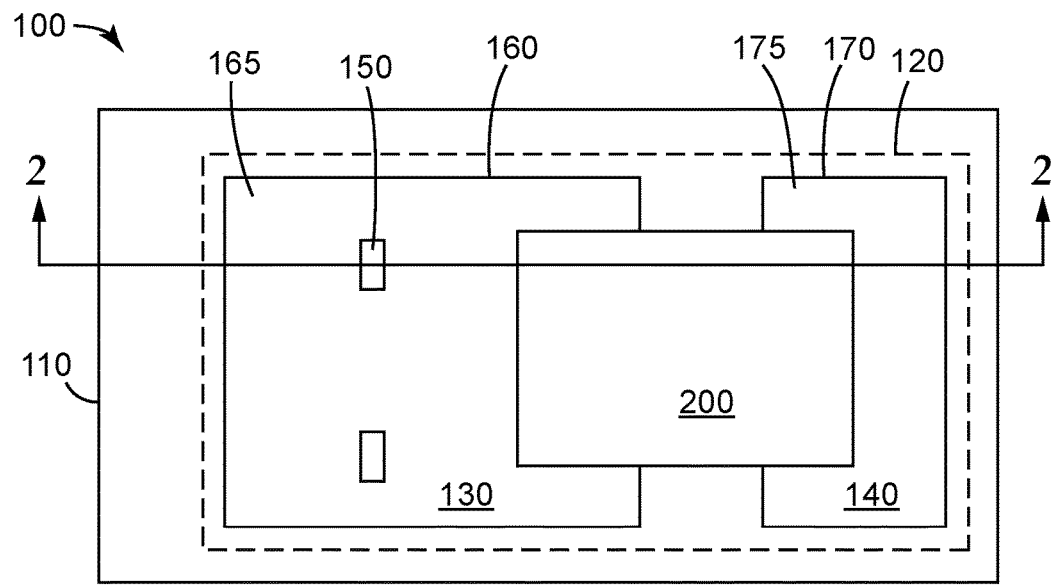
FIG. 1 is a schematic diagram top plan view of a flexible LESD assembly according to the present description.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties desired by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with," "stacked on" or "in contact with" another element, component or layer, it can be directly on, directly connected to, directly coupled with, directly stacked on, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

The present disclosure relates to a flexible light emitting semiconductor device (LESD) assembly. In particular a flexible multilayer construction for mounting a light emitting semiconductor device (LESD). A fiducial alignment mark is disposed within a LESD mounting region of the flexible multilayer construction. The fiducial alignment mark can be disposed within an interior perimeter of the first or second electrically conductive pads that can couple to terminals of an LESD. In some embodiments the fiducial mark forms a groove in the electrically conductive pad and is adapted to be proximate to and extend along a side of a first electrically conductive terminal of an LESD mounted in the LESD mounting region, such that when the first electrically conductive terminal is being electrically connected to the first electrically conductive pad using a conductive material that flows away from the first electrically conductive terminal toward the first groove, the first groove is sufficiently deep and wide so that a substantial portion of the flowing first electrically conductive terminal at least partially fills the first groove. While the present disclosure is not so limited, an appreciation of various aspects of the disclosure will be gained through a discussion of the examples provided below.

Figure 2:
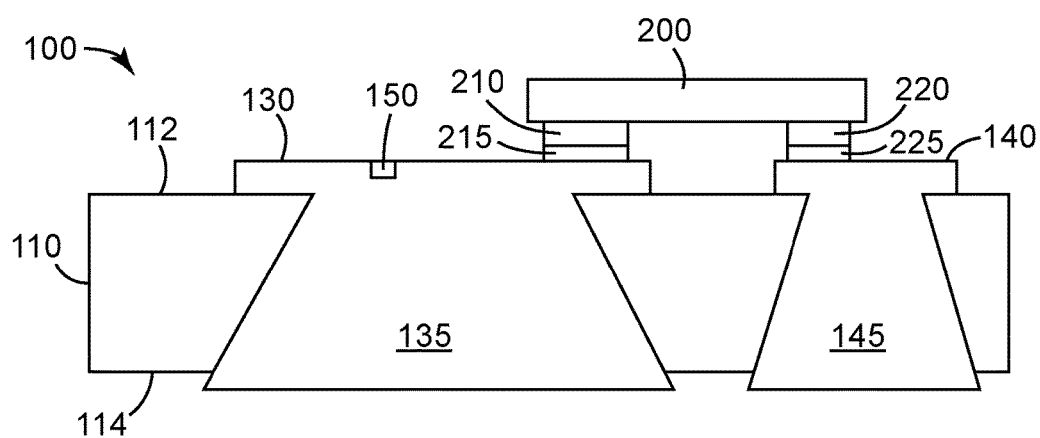
FIG. 2 is a schematic diagram cross-sectional view of a flexible LESD assembly of FIG. 1 taken along line 2-2.

FIG. 1 is a schematic diagram top plan view of a flexible LESD assembly 100 according to the present description. FIG. 2 is a schematic diagram cross-sectional view of a flexible LESD assembly 100 of FIG. 1 taken along line 2-2.

The flexible multilayer construction for mounting a light emitting semiconductor device (LESD) 100 includes a flexible dielectric substrate 110 having opposing top and bottom major surfaces 112,114 and an LESD mounting region 120 on the top major surface 112 for receiving an LESD 200. The LESD can include a light emitting diode or a laser diode.

In many embodiments the flexible dielectric substrate 110 is formed of a polymer material. In some embodiments, the flexible dielectric substrate is formed of polyimide. In other embodiments, the flexible dielectric substrate is formed of any other number of appropriate flexible polymers, including, but not limited to polyethylene terephthalate (PET), liquid crystalline polymer, polycarbonate, polyether ether ketone, or thermoplastic polymer.

A first electrically conductive pad 130 and a second electrically conductive pad 140 is located or disposed in the LESD mounting region 120 for electrically connecting to a corresponding first electrically conductive terminal 210 and a second electrically conductive terminal 220 of an LESD 200 received in the LESD mounting region 120.

A fiducial alignment mark 150 is disposed or located within the LESD mounting region 120. The fiducial alignment mark 150 provides for accurate placement of an LESD 200 in the LESD mounting region 120. The flexible LESD assembly 100 can include two or more fiducial alignment marks 150, as desired.

While two fiducial alignment marks 150 are illustrated on the first electrically conductive pad 130 in FIG. 1, it is understood that one or more fiducial alignment marks can be disposed on only the second electrically conductive pad 140. In some embodiments, fiducial alignment marks can be disposed on both the first electrically conductive pad 130 and the second electrically conductive pad 140.

In many embodiments, the one or more fiducial alignment marks 150 are disposed within an interior 165, 175 of a perimeter 160, 170 of the first and/or second electrically conductive pads 130, 140. In some embodiments, the fiducial alignment mark 150 is disposed between the first and second electrically conductive pads 130, 140. In these embodiments, the fiducial alignment mark 150 can be electrically insulating. The one or more fiducial alignment marks 150 can extend into and form one or more recesses in the first and/or second electrically conductive pads 130, 140 or can extend away from and form one more protrusions from the first and/or second electrically conductive pads 130, 140.

The one or more fiducial alignment marks 150 can be independently electrically conductive or electrically insulative.

In embodiments where the fiducial alignment mark forms a recess in the first electrically conductive pad, the recess can be formed any number of ways. In some of these embodiments, the fiducial alignment mark forms a recess in the first electrically conductive pad by removing some of the electrically conductive pad. In other embodiments, the fiducial alignment mark forms a recess in the first electrically conductive pad by electroplating a metal around the first fiducial alignment mark.

In embodiments where the fiducial alignment mark forms a protrusion from the first electrically conductive pad, the protrusion can be formed any number of ways. In some of these embodiments, the fiducial alignment mark forms a protrusion from the first electrically conductive pad by depositing a pattern on the first electrically conductive pad. In other embodiments, the fiducial alignment mark forms a protrusion from the first electrically conductive pad by removing some of the electrically conductive pad.

In many embodiments, the flexible multilayer construction for mounting a light emitting semiconductor device (LESD) 100 includes two or more a fiducial alignment marks 150, spaced apart from each other and disposed within the LESD mounting region 120 or disposed within the interior 165, 175 of the perimeter 160, 170 of the first and/or second electrically conductive pad 130, 140. In some embodiments, a first fiducial alignment mark 150 is disposed within or located within the interior 165 of the perimeter 160 of the first electrically conductive pad 130 and a second fiducial alignment mark 150 is disposed within or located within the interior 175 of the perimeter 170 of the second electrically conductive pad 140.

An LESD package includes the flexible multilayer construction 100 described herein and the LESD 200 mounted in the LESD mounting region 120 of the flexible dielectric substrate 110. The LESD 200 can includes a first conductive terminal 210 electrically connected to the first electrically conductive pad 130 and a second conductive terminal 220 electrically connected to the second electrically conductive pad 140. In many embodiments, at least a portion of the fiducial alignment mark 150 is visible in a plan view (see FIG. 1) of the LESD package. In some embodiments, the entire fiducial alignment mark 150 is visible in a plan view of the LESD package.

In embodiments where the LESD 200 is a flip-chip type light emitting semiconductor device, a first conductive material 215 is disposed between and connecting the first conductive terminal 210 to the first electrically conductive pad 130 and a second conductive material disposed 225 is between and connecting the second conductive terminal 220 to the second electrically conductive pad 140. The first and second conductive materials 215, 225 can independently be formed of one or more of a conductive paste, a conductive adhesive or a solder bump, for example.

In embodiments where the LESD 200 is a wire-bond type light emitting semiconductor device, a first electrically conductive wire connects the first conductive terminal to the first electrically conductive pad 130 and a second electrically conductive wire connects the second conductive terminal to the second electrically conductive pad 140.

The flexible multilayer construction 100 can further include a plurality of vias formed in the LESD mounting region 120. Each via extending between the top and bottom major surfaces 112, 114 and filled with an electrically conductive material to form a plurality of electrically conductive filled vias 135, 145. A first electrically conductive filled via 135 is electrically connected to the first electrically conductive pad 130. A second conductive filled via 145 is electrically connected to the second electrically conductive pad 140.

Figure 3:
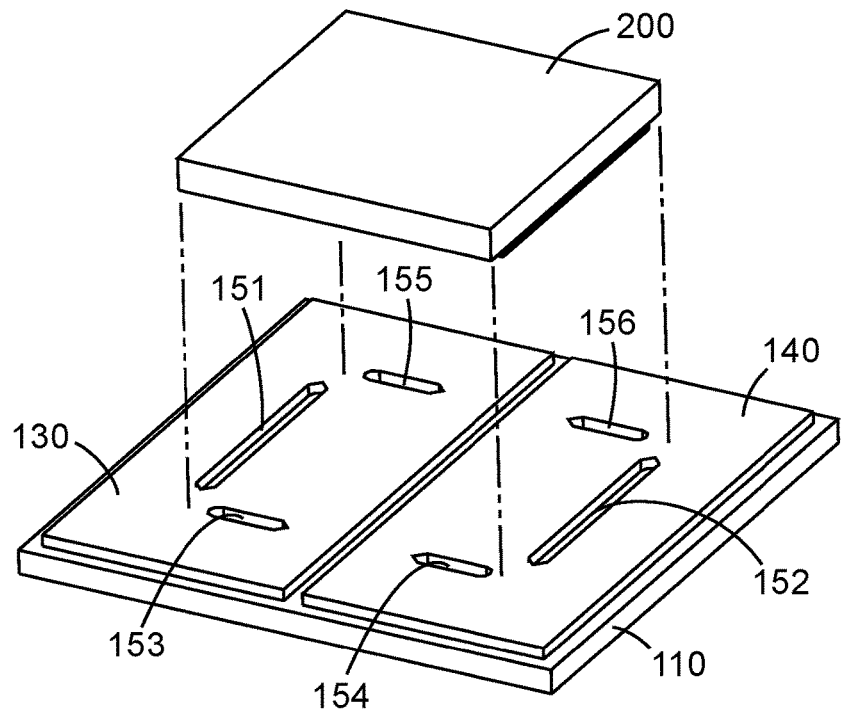
FIG. 3 is a schematic diagram perspective view of a flexible LESD assembly according to the present description.
Figure 4:
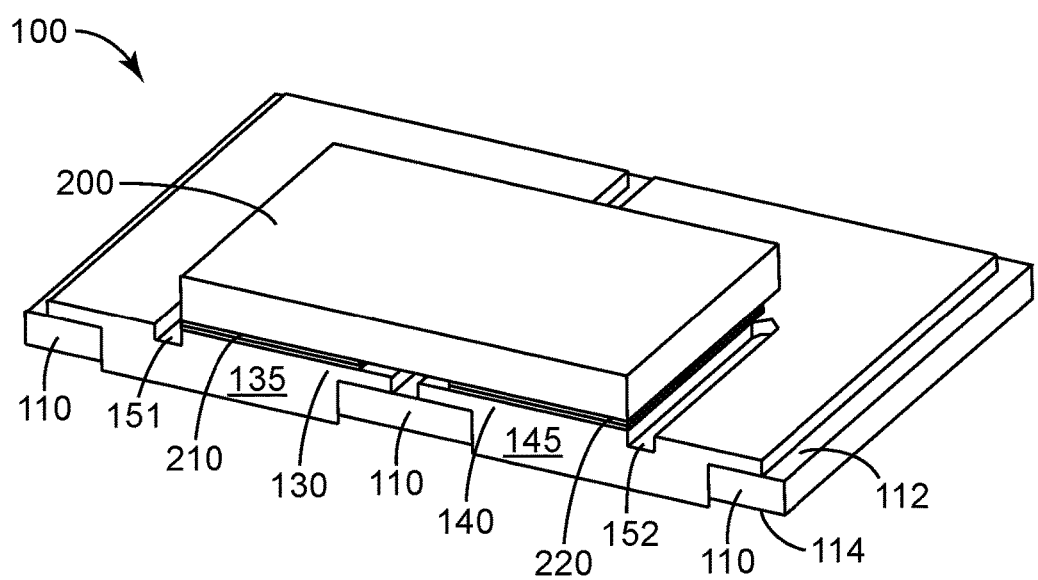
FIG. 4 is a schematic diagram perspective view of a sectioned portion of the assembled flexible LESD assembly of FIG. 3.

FIG. 3 is a schematic diagram perspective view of a flexible LESD assembly 100 according to the present description. FIG. 4 is a schematic diagram perspective view of a sectioned portion of the assembled flexible LESD assembly 100 of FIG. 3. FIG. 3 illustrates the LESD 200 exploded away from the LESD mounting region 120.

The flexible multilayer construction for mounting a light emitting semiconductor device (LESD) 100 includes a flexible dielectric substrate 110 having opposing top and bottom major surfaces 112, 114 and an LESD mounting region on the top major surface 112 for receiving an LESD 200. The LESD can include a light emitting diode or a laser diode.

A first electrically conductive pad 130 and a second electrically conductive pad 140 is located or disposed in the LESD mounting region for electrically connecting to a corresponding first electrically conductive terminal 210 and a second electrically conductive terminal 220 of an LESD 200 received in the LESD mounting region.

In these embodiments the fiducial alignment mark 151, 153, 155 forms a first groove in the first electrically conductive pad 130 and is adapted to be proximate to and extend along a first side of a first electrically conductive terminal 210 of an LESD 200 mounted in the LESD mounting region, such that when the first electrically conductive terminal 210 is being electrically connected to the first electrically conductive pad 130 using a conductive material that flows away from the first electrically conductive terminal 210 toward the first groove 151, the first groove 151 is sufficiently deep and wide so that a substantial portion of the flowing first electrically conductive terminal at least partially fills the first groove 151.

Likewise the fiducial alignment mark 152, 154, 156 forms a second groove in the second electrically conductive pad 140 and is adapted to be proximate to and extend along a first side of a second electrically conductive terminal 220 of an LESD 200 mounted in the LESD mounting region, such that when the second electrically conductive terminal 220 is being electrically connected to the second electrically conductive pad 140 using a conductive material that flows away from the second electrically conductive terminal 220 toward the second groove 152, the second groove 152 is sufficiently deep and wide so that a substantial portion of the flowing second electrically conductive terminal at least partially fills the second groove 152.

The one or more fiducial alignment marks 151, 152, 153, 154, 155, 156 are recesses forming one or more grooves so that during the process of electrically connecting the LESD to the flexible circuit, the electrically conductive material (for example: solder) can flow away from conductive terminal. At that time, the LESD could move from its original position drifting with the conductive material. One useful key effect of the grooves located along the electrically conductive terminal of the LESD is to restrict the movement of the LESD.

In many embodiments the fiducial alignment mark includes two or three grooves 151, 153, 155 in the first electrically conductive pad 130 that are adapted to be proximate to and extend along two or three sides of the first electrically conductive terminal 210 of an LESD 200 mounted in the LESD mounting region. In some embodiments, each groove 151, 153, 155 is adapted to be proximate to and extend along a different side of a first electrically conductive terminal 210 of an LESD 200 mounted in the LESD mounting region. As illustrated in FIG. 3.

In many embodiments the fiducial alignment mark includes two or three grooves 152, 154, 156 in the second electrically conductive pad 140 that are adapted to be proximate to and extend along two or three sides of the second electrically conductive terminal 220 of an LESD 200 mounted in the LESD mounting region. In some embodiments, each groove 152, 154, 156 is adapted to be proximate to and extend along a different side of a second electrically conductive terminal 220 of an LESD 200 mounted in the LESD mounting region. As illustrated in FIG. 3.

One or more grooves 151, 153, 155 can be formed in the first electrically conductive pad 130 within an interior of a perimeter of the first electrically conductive pad 130. Each of the one or more grooves 151, 153, 155 can be proximate to and extend along a side of a first electrically conductive terminal 210 of an LESD 200 mounted in the LESD mounting region, such that when the first electrically conductive terminal 210 is being electrically connected to the first electrically conductive pad 130 using a conductive material that flows away from the first electrically conductive terminal 130 toward the one or more grooves 151, 153, 155, the one or more grooves 151, 153, 155 are sufficiently deep and wide so that a substantial portion of the flowing first electrically conductive terminal 210 at least partially fills the one or more grooves.

Similarly, one or more grooves 152, 154, 156 can be formed in the second electrically conductive pad 140 within an interior of a perimeter of the second electrically conductive pad 140. Each of the one or more grooves 152, 154, 156 can be proximate to and extend along a side of a second electrically conductive terminal 220 of an LESD 200 mounted in the LESD mounting region, such that when the second electrically conductive terminal 220 is being electrically connected to the second electrically conductive pad 140 using a conductive material that flows away from the second electrically conductive terminal 140 toward the one or more grooves 152, 154, 156, the one or more grooves 152, 154, 156 are sufficiently deep and wide so that a substantial portion of the flowing second electrically conductive terminal 220 at least partially fills the one or more grooves.

In many embodiments, when the first electrically conductive terminal 210 is electrically connected to the first electrically conductive pad 130, in a plan view, at least a portion of each groove 151, 153, 155 is outside an outer boundary of the LESD. In some of these embodiments, each groove 151, 153, 155 is visible in plan view. In selected embodiments, the entire groove 151, 153, 155 is visible in plan view.

The fiducial alignment mark described herein can be formed by any useful manner. As described above, material can be removed or not disposed with forming the electrically conductive pads to form the fiducial alignment mark or material can be added to the electrically conductive pads to form the fiducial alignment mark.

An illustrative method of forming a flexible multilayer construction for mounting a light emitting semiconductor device (LESD) includes, providing a flexible dielectric substrate 110 having opposing top and bottom major surfaces 112, 114 and defining an LESD mounting region 120 on the top major surface 112 of the flexible dielectric substrate 110 for receiving an LESD 200.

Then a pattern is formed corresponding to a first fiducial alignment mark in the LESD mounting region and first and second electrically conductive pads 130, 140 are formed in the LESD mounting region for electrically connecting to corresponding first and second electrically conductive terminals 210, 220 of an LESD 200. The first electrically conductive pad 130 bordering a perimeter of the first fiducial mark. In many embodiments, the step of forming first and second electrically conductive pads 130, 140 include electroplating a metal onto the flexible dielectric substrate 110.

Then the method includes removing the pattern resulting in a first fiducial alignment 150 formed within an interior of a perimeter of the first electrically conductive pad 130.

Thus, embodiments of FIDUCIAL MARK FOR CHIP BONDING are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A flexible multilayer construction for mounting a light emitting semiconductor device (LESD), comprising:
    a flexible dielectric substrate comprising opposing top and bottom major surfaces and an LESD mounting region on the top major surface for receiving an LESD;
    first and second electrically conductive pads disposed in the LESD mounting region for electrically connecting to corresponding first and second electrically conductive terminals of an LESD received in the LESD mounting region; and
    a first fiducial alignment mark for an accurate placement of an LESD in the LESD mounting region, the first fiducial alignment mark disposed within an interior of the first or second electrically conductive pad.

2. The flexible multilayer construction of claim 1, wherein the first fiducial alignment mark is disposed within an interior of a perimeter of one of the first and second electrically conductive pads.

3. The flexible multilayer construction of claim 1, wherein the first fiducial alignment mark is disposed between the first and second electrically conductive pads.

4. The flexible multilayer construction of claim 1, wherein the first fiducial alignment mark forms a recess in the first electrically conductive pad.

5. The flexible multilayer construction of claim 1, wherein the first fiducial alignment mark forms a protrusion on the first electrically conductive pad.

6. The flexible multilayer construction of claim 1, wherein the first fiducial alignment mark is electrically insulative.

7. The flexible multilayer construction of claim 1 further comprising a second fiducial alignment mark, spaced apart from the first fiducial alignment mark, disposed within the LESD mounting region or disposed within the interior of the perimeter of the first electrically conductive pad.

8. An LESD package, comprising:
    the flexible multilayer construction of claim 1;
    an LESD mounted in the LESD mounting region of the flexible dielectric substrate, the LESD having a first conductive terminal electrically connected to the first electrically conductive pad and a second conductive terminal electrically connected to the second electrically conductive pad, wherein at least a portion of the first fiducial alignment mark is visible in a plan view of the LESD package.

9. The LESD package of claim 8, wherein the entire first fiducial alignment mark is visible in a plan view of the LESD package.

10. The LESD package of claim 8, a first conductive material disposed between and connecting the first conductive terminal to the first electrically conductive pad, a second electrically conductive wire connecting the second conductive terminal to the second electrically conductive pad.

11. The LESD of claim 10, wherein the first conductive material comprises one or more of a conductive paste, a conductive adhesive or a solder bump.

12. The flexible multilayer construction of claim 1 further comprising a plurality of vias formed in the LESD mounting region, each via extending between the top and bottom major surfaces and filled with an electrically conductive material to form a plurality of electrically conductive filled vias, a first conductive filled via in the plurality of conductive filled vias electrically connected to the first electrically conductive pad, a second conductive filled via in the plurality of conductive filled vias electrically connected to the second electrically conductive pad.

13. The flexible multilayer construction of claim 1, wherein the first fiducial alignment mark forms a first groove in the first electrically conductive pad and is adapted to be proximate to and extend along a first side of a first electrically conductive terminal of an LESD mounted in the LESD mounting region, such that when the first electrically conductive terminal is being electrically connected to the first electrically conductive pad using a conductive material that flows away from the first electrically conductive terminal toward the first groove, the first groove is sufficiently deep and wide so that a substantial portion of the flowing first electrically conductive terminal at least partially fills the first groove.

14. The flexible multilayer construction of claim 1, wherein the first fiducial alignment mark forms a plurality of grooves in the first electrically conductive pad, each groove adapted to be proximate to and extend along a side of a first electrically conductive terminal of an LESD mounted in the LESD mounting region, such that when the first electrically conductive terminal is being electrically connected to the first electrically conductive pad using a conductive material that flows away from the first electrically conductive terminal toward one or more grooves in the plurality of grooves, the one or more grooves are sufficiently deep and wide so that a substantial portion of the flowing first electrically conductive terminal at least partially fills the one or more grooves.

15. The flexible multilayer construction of claim 14, such that when the first electrically conductive terminal is electrically connected to the first electrically conductive pad, in a plan view, at least a portion of each groove in the plurality of grooves is outside an outer boundary of the LESD.

16. The flexible multilayer construction of claim 14, wherein each groove in the plurality of grooves is adapted to be proximate to and extend along a different side of a first electrically conductive terminal of an LESD mounted in the LESD mounting region.

17. A flexible multilayer construction for mounting a light emitting semiconductor device (LESD), comprising:
   a flexible dielectric substrate comprising opposing top and bottom major surfaces and an LESD mounting region on the top major surface for receiving an LESD;
   first and second electrically conductive pads disposed in the LESD mounting region for electrically connecting to corresponding first and second electrically conductive terminals of an LESD received in the LESD mounting region; and
   one or more grooves formed in the first electrically conductive pad within an interior of a perimeter of the first electrically conductive pad, each of the one or more grooves adapted to be proximate to and extend along a side of a first electrically conductive terminal of an LESD mounted in the LESD mounting region, such that when the first electrically conductive terminal is being electrically connected to the first electrically conductive pad using a conductive material that flows away from the first electrically conductive terminal toward the one or more grooves, the one or more grooves are sufficiently deep and wide so that a substantial portion of the flowing first electrically conductive terminal at least partially fills the one or more grooves.

18. The flexible multilayer construction of claim 17, such that when the first electrically conductive terminal is electrically connected to the first electrically conductive pad, in a plan view, at least a portion of each groove in the plurality of grooves is outside an outer boundary of the LESD.

19. The flexible multilayer construction of claim 17, wherein each groove in the one or more grooves is adapted to be proximate to and extend along a different side of a first electrically conductive terminal of an LESD mounted in the LESD mounting region.

20. The flexible multilayer construction of claim 17, wherein each groove in the one or more grooves is visible in a plan view.

* * * * *